(12) United States Patent
Verspecht

(10) Patent No.: US 6,930,564 B2
(45) Date of Patent: Aug. 16, 2005

(54) PROVIDING CONTROLLABLE IMPEDANCE AT A REFERENCE PLANE IN A CIRCUIT

(75) Inventor: Jan Verspecht, Steenhufffel (BE)

(73) Assignee: Agilent Technologies, Inc., Palo Alto, CA (US)

( * ) Notice: Subject to any disclaimer, the term of this patent is extended or adjusted under 35 U.S.C. 154(b) by 138 days.

(21) Appl. No.: 10/655,097

(22) Filed: Sep. 4, 2003

(65) Prior Publication Data

US 2004/0085136 A1 May 6, 2004

(30) Foreign Application Priority Data

Oct. 30, 2002 (EP) ............................................ 02257530

(51) Int. Cl.⁷ ................................................. H01P 1/32
(52) U.S. Cl. ........................... 333/1.1; 333/124; 326/30
(58) Field of Search ............................. 326/30, 38, 82; 333/1.1, 32, 124, 109, 246

(56) References Cited

U.S. PATENT DOCUMENTS

| | | | |
|---|---|---|---|
| 3,789,301 A | | 1/1974 | Malaviya ..................... 324/158 |
| 4,072,897 A | | 2/1978 | Takayama ................... 324/158 |
| 4,205,281 A | * | 5/1980 | Nagao ......................... 333/1.1 |
| 5,034,708 A | | 7/1991 | Adamian et al. ........... 333/161 |
| 5,276,411 A | | 1/1994 | Woodin, Jr. et al. .......... 333/22 |
| 6,163,499 A | * | 12/2000 | Suzuki ................... 365/230.06 |
| 6,297,649 B1 | | 10/2001 | Tsironis ....................... 324/642 |
| 6,335,665 B1 | | 1/2002 | Mendelsohn ................ 333/139 |
| 2002/0130667 A1 | | 9/2002 | Noe ............................ 324/534 |
| 2004/0196085 A1 | * | 10/2004 | Shen .......................... 327/277 |
| 2004/0251983 A1 | * | 12/2004 | Hsu et al. ..................... 333/32 |
| 2005/0040845 A1 | * | 2/2005 | Park ............................. 326/30 |

OTHER PUBLICATIONS

Six, G., European Search Report Application No. EP 02 25 7530 dated Apr. 14, 2003.

Muller et al. "Comparison of Active Versus Passive On–Wafer Load–Pull Characterization of Microwave and MM–Wave Power Devices," 1994, IEEE, pp. 1077–1080.

Alekseev, E. "W–Band On–Wafer Load–Pull Measurement System and its Application to HEMT Characterization," 1998, MTT–S International Microwave Symposium Digest, vol. 3, pp. 1479–1482.

* cited by examiner

*Primary Examiner*—Don Le

(57) ABSTRACT

Apparatus for providing a controllable impedance at a reference plane in a circuit comprises a unidirectional transmission line loop having first and second input/output terminals. The first input/output terminal is connected to the reference plane and an amplifier is located in the transmission line loop to amplify signals passing in a direction from the second input/output terminal to the first input/output terminal. A variable tuned circuit couples the second input/output terminal to a terminating device.

11 Claims, 2 Drawing Sheets

PROVIDING CONTROLLABLE IMPEDANCE AT A REFERENCE PLANE IN A CIRCUIT

TECHNICAL FIELD

This invention relates to methods and apparatus for providing a controllable impedance at a reference plane in a circuit, for example to constitute a load with a desired arbitrary impedance at radio or microwave frequencies or to provide a signal generator with a desired output impedance.

BACKGROUND ART

Continuing developments in radio and microwave frequency components (e.g. power transistors and monolithic microwave integrated circuits—MMICs) have resulted in the desirability of performing on-wafer load-pull measurements, to speed up development of such devices. A load-pull technique involves the provision of an arbitrary (controlled) impedance at a predetermined location (the reference plane) in a circuit, for example the location where a device under test (DUT) will be connected.

An analogous need exists for the provision of a signal generator with an arbitrary controlled output impedance at a reference plane (known as source-pull).

Existing techniques for implementing load-pull measurements are summarised and reviewed in, for example, "Comparison of active versus passive on-wafer load-pull characterization of microwave and mm-wave power devices" by J.-E. Muller and B. Gyselinckx, *IEEE MTT-S Digest*, 1994, pp. 1077–1080 (WE3F-40). These techniques can be classified as either:

Passive loads, such as slide-screw mechanical or solid-state tuners. These have many advantages, including low risk of oscillation, high power-handling capability and simple and precise controllability. However, they also have a severely limited maximum load reflection coefficient at the probe tip connected to the DUT, owing to power losses in the cables and connectors. This restricts the range of impedances that can be generated, and is a severe limitation for on-wafer characterization of power transistors.

Active loads, incorporating an amplifier and either a power splitter to provide two signal paths to drive both ports of a DUT, or a feedback arrangement including a single directional coupler or circulator. The two signal paths approach has a low risk of oscillation, but a power sweep in the non-linear regime of the DUT requires a complicated sequence of settings of adjustable components at each power level to keep the reflection coefficient constant. The feedback arrangement avoids this problem, but has a higher risk of oscillations, especially if a broadband amplifier is included in the feedback path, as well as other limitations.

DISCLOSURE OF INVENTION

According to one aspect of this invention there is provided an apparatus for providing a controllable impedance at a reference plane in a circuit, comprising:

a unidirectional transmission line loop having first and second input/output terminals, the first input/output terminal being connected to the reference plane;

amplifying means located in the transmission line loop to amplify signals passing in a direction from the second input/output terminal to the first input/output terminal; and a variable tuned circuit coupling the second input/output terminal to a terminating device.

According to another aspect of this invention there is provided a method of providing a controllable impedance at a reference plane in a circuit, comprising the steps of:

connecting the reference plane to a first input/output terminal of a unidirectional transmission line loop which also has a second input/output terminal;

amplifying signals passing through the transmission line loop in a direction from the second input/output terminal to the first input/output terminal; and controlling a variable tuned circuit coupling the second input/output terminal to a terminating device.

BRIEF DESCRIPTION OF DRAWINGS

A method and apparatus in accordance with this invention, for providing a controllable impedance at a reference plane in a circuit, will now be described, by way of example, with reference to the accompanying drawings, in which.

DETAILED DESCRIPTION

Figure 1:
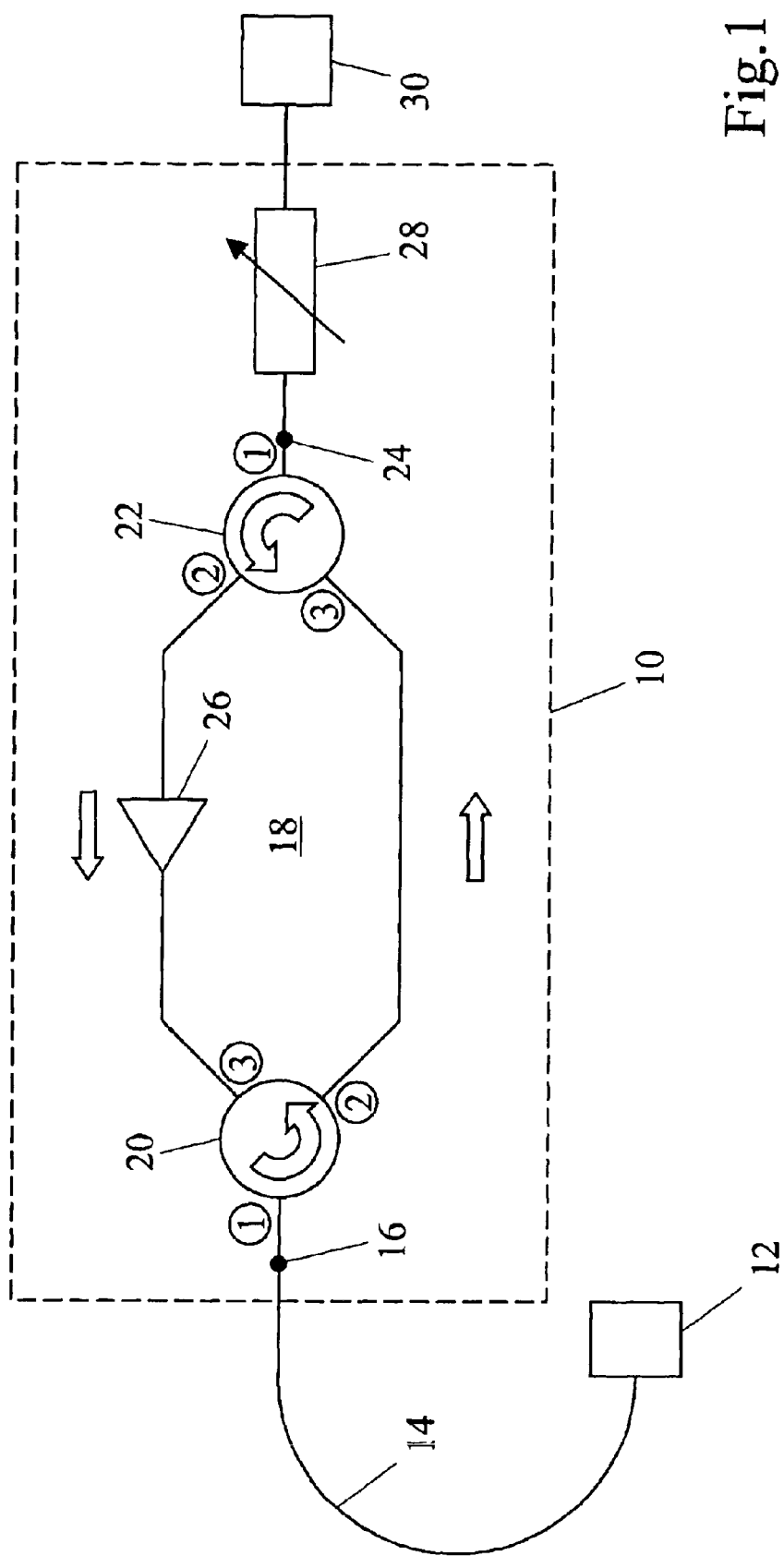
FIG. 1 shows an embodiment of the invention.

Referring to FIG. 1, an apparatus 10 is shown for providing a controllable impedance of arbitrary value at a calibration reference plane 12. This reference plane is for example the location of the interface between measurement probes of a radio or microwave frequency test equipment incorporating the apparatus 10 and a DUT such as a power transistor or a power MMIC. The apparatus 10 is coupled to the reference plane 12 by a "passive structure" 14 which typically contains a wafer probe (the tips of which define the reference plane), several adaptors, and connectors and couplers of a reflectometer test-set.

The passive structure 12 is connected within the apparatus 10 to a first input/output terminal 16 of a transmission line loop 18 comprising two circulators 20 and 22. Each circulator has three ports (numbered 1 to 3 in FIG. 1), and operates to enable flow of electromagnetic energy input at one port towards the next port in sequence only, that is port 1 to port 2, port 2 to port 3 and port 3 to port 1. The input/output terminal 16 is connected to port 1 of the circulator 20. Port 2 of this circulator is used as an output port and is connected to port 3 of the circulator 22, used as an input port. This connection enables flow of electromagnetic energy through the transmission line loop 18 from its input/output terminal 16 to a second input/output terminal 24, which is connected to port 1 of the circulator 22. Likewise port 2 of the circulator 22 is connected to port 3 of the circulator 20, for flow of electromagnetic energy through the transmission line loop 18 in the reverse direction, via an amplifier 26 which is interposed between the circulators 22 and 20. Accordingly, as can be seen in FIG. 1, the flow of energy around the transmission line loop is substantially unidirectional (in this example, anti-clockwise as viewed in FIG. 1).

The second input/output terminal 24 is connected to a tuner 28 (which may for example be a slide screw tuner) that is in turn terminated by a load 30. In the case of load-pull applications the load 30 comprises a matched impedance (e.g. 50 ohms); in the case of source-pull applications the load 30 is a signal generator.

The tuner 28 generates internally a reflection of part of the incident voltage wave, with precisely controlled amplitude and phase. The rest of the voltage wave (which is not reflected) continues further to the load 30, which absorbs this un-reflected part. If the load 30 were not present a secondary reflection would occur from the end of the transmission line, and would generate a standing wave pattern inside the tuner 28. This would cause controllability problems and would make it hard to synthesize real-component parts of the impedance close to 50 ohms.

The synthesis of a desired impedance at the reference plane 12 is achieved through the generation of a corresponding travelling voltage wave reflection coefficient. A travelling voltage wave which enters the reference plane 12 (e.g. from a DUT) traverses the passive structure 14 and enters the circulator 20, which directs the wave along the lower arm (as viewed in FIG. 1) of the transmission line loop 18. The travelling wave enters the circulator 22 where it is directed to the input of the tuner 28. This tuner enables generation of a modified (reflected) version of the travelling voltage wave with a precise, controllable phase and amplitude relationship to the incident travelling wave.

This reflected wave generated by the tuner 28 enters the circulator 22, which directs it along the upper arm of the transmission line loop 18, through the amplifier 26. The resulting amplified version of the reflected voltage wave at the output of the amplifier 26 goes through the circulator 20 and traverses the passive structure 14 to reach the reference plane 12. Adjustment of the tuner 28 enables the complex ratio between the original travelling voltage wave entering the reference plane 12 (from the DUT) and the reflected voltage wave returning to the reference plane 12 via the passive structure 14 to be precisely controlled. Reflection coefficients with an amplitude of one (and values even higher than one) can be readily attained, provided that the gain of the amplifier 26 is sufficient to compensate for the losses which occur in the circuitry between the reference plane 12 and the tuner 28.

Figure 2:
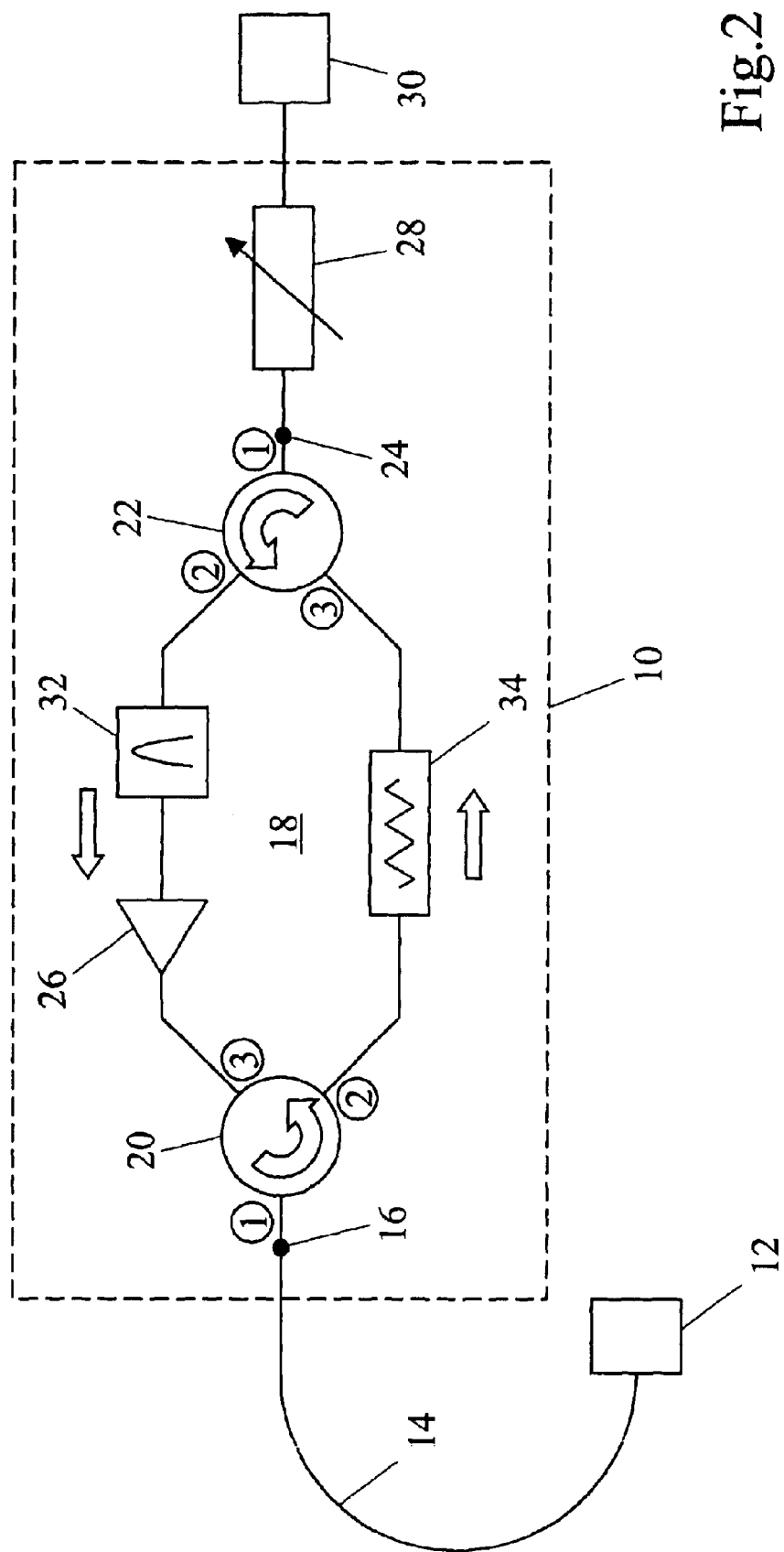
FIG. 2 shows a modified form of that embodiment.

FIG. 1 shows a basic form of this embodiment of the invention. In practice and as shown in FIG. 2, it may be found desirable to include a bandpass filter 32 at the input to the amplifier 26, and/or an attenuator 34 in the lower arm of the transmission line loop 18. The bandpass filter 32 may be included to improve the stability of operation of the transmission line loop, in order to attenuate signal components at frequencies for which the loop would otherwise become unstable. Inclusion of a bandpass filter reduces the risk of oscillations. The pass band of the filter 32 is chosen empirically, depending on the extent to which instability is found to occur, to avoid closed-loop gains in excess of unity outside the set of frequencies of interest for which the desired impedance at the reference plane 12 is being generated. The frequency limits of the pass band depend upon the particular ensemble of characteristics of the test configuration, including the properties of the DUT.

The attenuator 34 may be included to compensate for any excess gain of the amplifier 26 in particular test situations. The value of the attenuator 34 is chosen such that the overall gain of the transmission line loop 18 (the gain of the amplifier 26 minus the attenuation of the attenuator 34) is sufficient to compensate for the circuit losses but is not excessively large. Having an overall gain which is too large results in potential instability and oscillations, and can also cause excessive sensitivity of the synthesized reflection coefficient to small changes in setting of the tuner 28.

Inclusion of the bandpass filter 32 and the attenuator 34 facilitates compensation for variations in the operating characteristics of the circuit which are introduced by changes in the test setup and sub-optimal properties of components (e.g. excess gain of the amplifier 26 or frequency-dependent losses in connecting cables). In specific situations it may be feasible and cost-effective to select components and equipment to interact in an integrated manner and provide the desired stability and ease of operation without inclusion of the bandpass filter 32 or the attenuator 34. The specific locations of the filter 32 and the attenuator 34 in the transmission line loop 18 are not critical, provided each of them is in the loop.

Other modifications can be made to the circuits described above. For example, couplers could be used instead of circulators to create the transmission line loop 18, although this would be likely to increase significantly the required gain and output power capability of the amplifier 26.

What is claimed is:

1. Apparatus for providing a controllable impedance at a reference plane in a circuit, comprising:

a unidirectional transmission line loop having first and second input/output terminals, the first input/output terminal being connected to the reference plane;

amplifying means located in the transmission line loop to amplify signals passing in a direction from the second input/output terminal to the first input/output terminal; and a variable tuned circuit coupling the second input/output terminal to a terminating device.

2. The apparatus of claim 1, wherein the terminating device comprises a matched-impedance load.

3. The apparatus of claim 1, where in the terminating device comprises a signal generator.

4. The apparatus of claim 1, wherein the transmission line loop comprises two circulators each of which has two adjacent ports coupled to two adjacent ports of the other circulator.

5. The apparatus of claim 1, wherein a bandpass filter is located in the transmission line loop.

6. The apparatus of claim 5, wherein the bandpass filter is located in series with the amplifying means.

7. The apparatus of claim 1, wherein an attenuator is located in the transmission line loop.

8. The apparatus of claim 7, wherein the attenuator is located to attenuate signals passing in a direction from the first input/output terminal to the second input/output terminal.

9. A method of providing a controllable impedance at a reference plane in a circuit, comprising the steps of:

connecting the reference plane to a first input/output terminal of a unidirectional transmission line loop which also has a second input/output terminal;

amplifying signals passing through the transmission line loop in a direction from the second input/output terminal to the first input/output terminal; and controlling a variable tuned circuit coupling the second input/output terminal to a terminating device.

10. The method of claim 9, including the step of bandpass filtering the signals passing through the transmission line loop in the direction from the second input/output terminal to the first input/output terminal.

11. The method of claim 9, including the step of attenuating signals passing in a direction from the first input/output terminal to the second input/output terminal.

* * * * *